United States Patent
Cho et al.

(10) Patent No.: US 7,118,926 B2
(45) Date of Patent: Oct. 10, 2006

(54) METHOD OF OPTIMIZING SEASONING RECIPE FOR ETCH PROCESS

(75) Inventors: Hong Cho, Suwon-si (KR); Chang-Jin Kang, Suwon-si (KR); Kyeong-Koo Chi, Seoul (KR); Cheol-Kyu Lee, Yongin-si (KR); Hye-Jin Jo, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 178 days.

(21) Appl. No.: 10/652,403

(22) Filed: Aug. 29, 2003

(65) Prior Publication Data

US 2004/0058459 A1    Mar. 25, 2004

(30) Foreign Application Priority Data

Sep. 19, 2002    (KR) ............... 10-2002-0057194

(51) Int. Cl.
*H01L 21/00*    (2006.01)

(52) U.S. Cl. ............................. 438/9; 216/60

(58) Field of Classification Search .................... 438/7, 438/9, 706, 712, 714, 719, 721, 723; 216/60
See application file for complete search history.

(56) References Cited

U.S. PATENT DOCUMENTS

| | | | | |
|---|---|---|---|---|
| 5,767,018 A | * | 6/1998 | Bell | ............................. 436/696 |
| 5,964,980 A | * | 10/1999 | Robinett | ................. 156/345.25 |
| 6,046,796 A | * | 4/2000 | Markle et al. | ................. 356/72 |
| 6,274,500 B1 | * | 8/2001 | Xuechun et al. | ............ 438/706 |
| 6,399,507 B1 | * | 6/2002 | Nallan et al. | ............... 438/706 |
| 6,660,127 B1 | * | 12/2003 | Nallan et al. | .......... 156/345.48 |
| 2004/0166598 A1 | * | 8/2004 | Miya et al. | ..................... 438/9 |
| 2005/0082482 A1 | * | 4/2005 | Ludviksson | ................. 250/342 |
| 2005/0143952 A1 | * | 6/2005 | Tomoyasu et al. | .......... 702/181 |

FOREIGN PATENT DOCUMENTS

| | | |
|---|---|---|
| JP | 10233387 | 9/1998 |
| KR | 10005085 | 1/2001 |

* cited by examiner

*Primary Examiner*—Kin-Chan Chen
(74) *Attorney, Agent, or Firm*—F. Chau & Associates, LLC

(57) ABSTRACT

A method for optimizing a seasoning recipe for a dry etch process. The method includes setting a critical value of reproducibility, a main etch recipe, and a preliminary seasoning recipe. A test wafer is then etched using the preliminary seasoning recipe in a dry etch chamber. Next, a main etch process is performed with respect to at least 10 run wafers in the dry etch chamber using the main etch recipe and an end-point detection time for each wafer is determined. An initial dispersion and a standard deviation are then determined using the determined end-point detection times. The critical value of reproducibility is then compared to the initial dispersion. If the initial dispersion is equal to or less than the critical value of reproducibility, the preliminary seasoning recipe is used as the seasoning recipe, otherwise the preliminary seasoning recipe is modified and the process is repeated until an optimal seasoning recipe is determined.

14 Claims, 3 Drawing Sheets

METHOD OF OPTIMIZING SEASONING RECIPE FOR ETCH PROCESS

TECHNICAL FIELD OF THE INVENTION

The present invention relates to a dry etching method for fabricating a semiconductor device, and more particularly, to a method of optimizing a seasoning recipe for a dry etch process.

BACKGROUND

As semiconductor devices become more highly integrated, the design rules are reduced. Thus, in a dry etch process, it is important to have a high etch selectivity and a high anisotropy to properly etch a wafer. Also, it is important to be able to reproduce the same etch for each wafer that passes through the dry etch process.

In a dry etch process, the initial set of wafers that are processed can be spoiled when the dry etch processing chamber is not stabilized. In other words, if the ambient atmosphere within the chamber has not reached steady state, an unsteady etch rate can result.

This problem also occurs after a series of wafers have been processed or the dry etch process remains idle for a period of time between etch processes. Thus, a "seasoning process" is performed to prevent these problems by using a test wafer before a main etch process. Here, "seasoning process" means a process of etching a test wafer before performing a main etch process in the same chamber. In a conventional method, a recipe for a seasoning process is the same as that of a main etch process. However, immediately after finishing the seasoning process, the ambient atmosphere in the chamber may still not be stabilized, which results in an unsteady etch rate in the main etch process.

FIG. 1 is a graph showing experimental results obtained using a conventional dry etch process. In FIG. 1, the results of two test cases are shown. In case 1, a seasoning process was performed using a test wafer with an oxide layer in a dry etch chamber. Then, a main etch process was performed in the same chamber using a run wafer having a polysilicon layer and a tungsten silicide layer sequentially stacked on the wafer. Further, the run wafer included a hard mask pattern formed on the tungsten silicide layer. In the main etch process, the tungsten silicide layer was etched using the hard mask pattern by supplying $Cl_2$ and $SF_6$. An end-point detection time was determined as the time when the tungsten silicide layer was completely etched, as measured using an optical emission spectroscopy. Next, the polysilicon layer was etched by supplying HBr and $O_2$. In a seasoning process (which was performed before the main etch process), a test wafer with an oxide layer was etched by supplying the same etch gases, under the same conditions and with the same sequences, as in the main etch process.

In case 2, the same main etch process was used as in case 1. However, in the seasoning process of case 2, a test wafer having a polysilicon layer was etched. Further, the main etch recipe used in case 2 was identical with that of case 1. In case 1 and case 2, each of the main etches were repeatedly performed on multiple wafers of at least one lot.

As illustrated in FIG. 1, with case 1, after the seasoning process was performed with respect to the test wafer with the oxide layer, an end-point detection time in the first main etch process was determined to be greater than the end-point detection times of subsequently processed wafers. As subsequent wafers were processed through the main etch process, the end-point detection time gradually decreased and stabilized. Furthermore, in case 2, after performing a seasoning process with respect to the test wafer with the polysilicon layer, an end-point detection time of a first main etch process was determined to be less than the end-point detection times of subsequently processed wafers. As subsequent wafers were processed through the main etch process, the end-point detection time gradually increased and stabilized. Thus, as is apparent from FIG. 1, although a seasoning process was performed in the conventional dry etch process with respect to a test wafer by using the same etch recipe with that of the main etch process, the conventional method did not provide a constant etch rate for the main etch process.

Therefore, a need exists for a reproducible dry etch process that reduces the number of wafers that are spoiled during the start-up of a dry etch process.

SUMMARY OF THE INVENTION

The present invention is directed to methods for providing a reproducible dry etch process by optimizing a seasoning recipe. According to one embodiment of the present invention, a method is provided for determining an optimized seasoning recipe for a dry etch process. The method comprises (a) selecting a critical value of reproducibility; (b) selecting a main etch recipe; (c) selecting a preliminary seasoning recipe; (d) etching a test wafer using the preliminary seasoning recipe in a dry etch chamber; (e) performing a main etch process for a plurality of run wafers in the dry etch chamber using the main etch recipe, and determining an end-point detection time of each run wafer; (f) determining an initial dispersion and a standard deviation using the determined end-point detection times; (g) comparing the initial dispersion to the critical value of reproducibility; and (h) selecting the preliminary seasoning recipe as a seasoning recipe for the etch process, if the initial dispersion is less than or equal to the critical value of reproducibility. In addition, the method comprises changing the preliminary seasoning recipe and repeating steps (c)–(h), if the initial dispersion is greater than the critical value of reproducibility.

According to another embodiment of the present invention, the critical value of reproducibility is set to be proportional to the standard deviation. The critical value of reproducibility is 1 to 6 time(s) of the standard deviation. The initial dispersion is an absolute value of difference between an end-point detection time of a first run wafer and a third run wafer. The standard deviation is calculated by using end-point detection times of a fourth run wafer through at least a tenth run wafer.

According to another embodiment of the present invention, the test wafer may include an oxide layer or a polysilicon layer formed on a substrate. The run wafer may include a polysilicon layer and a tungsten silicide layer which are sequentially stacked on a substrate. The end-point detection time is determined when the tungsten silicide layer is substantially or completely etched. The main etch recipe and the preliminary seasoning recipe use the same etch gas. In addition, the same etch gas may be a mixed gas of HBr and $O_2$. Flow rates of the HBr and $O_2$ may be changed when resetting a preliminary seasoning recipe.

In yet another embodiment of the invention, a method for optimizing a seasoning recipe for a dry etch process comprises the steps of (a) selecting a preliminary seasoning recipe; (b) etching one or more test wafers using the preliminary seasoning recipe in a dry etch chamber and then performing a main etch process for a plurality of run wafers in the dry etch chamber using a main etch recipe to determine an end-point detection time of each run wafer; and (c) processing the end-point detection times of the run wafers to determine one or more optimization parameters; and (d) evaluating the optimization parameters to determine whether to (i) use the preliminary seasoning recipe as a seasoning recipe for the dry etch process or to (ii) modify the preliminary seasoning recipe and repeat steps (b)–(d) using the modified seasoning recipe.

These and other embodiments, features, aspects, and advantages of the present invention will be described and become apparent from the following detailed description of the preferred embodiments when read in conjunction with the accompanying drawings.

DETAILED DESCRIPTION OF PREFERRED EMBODIMENTS

Figure 1:
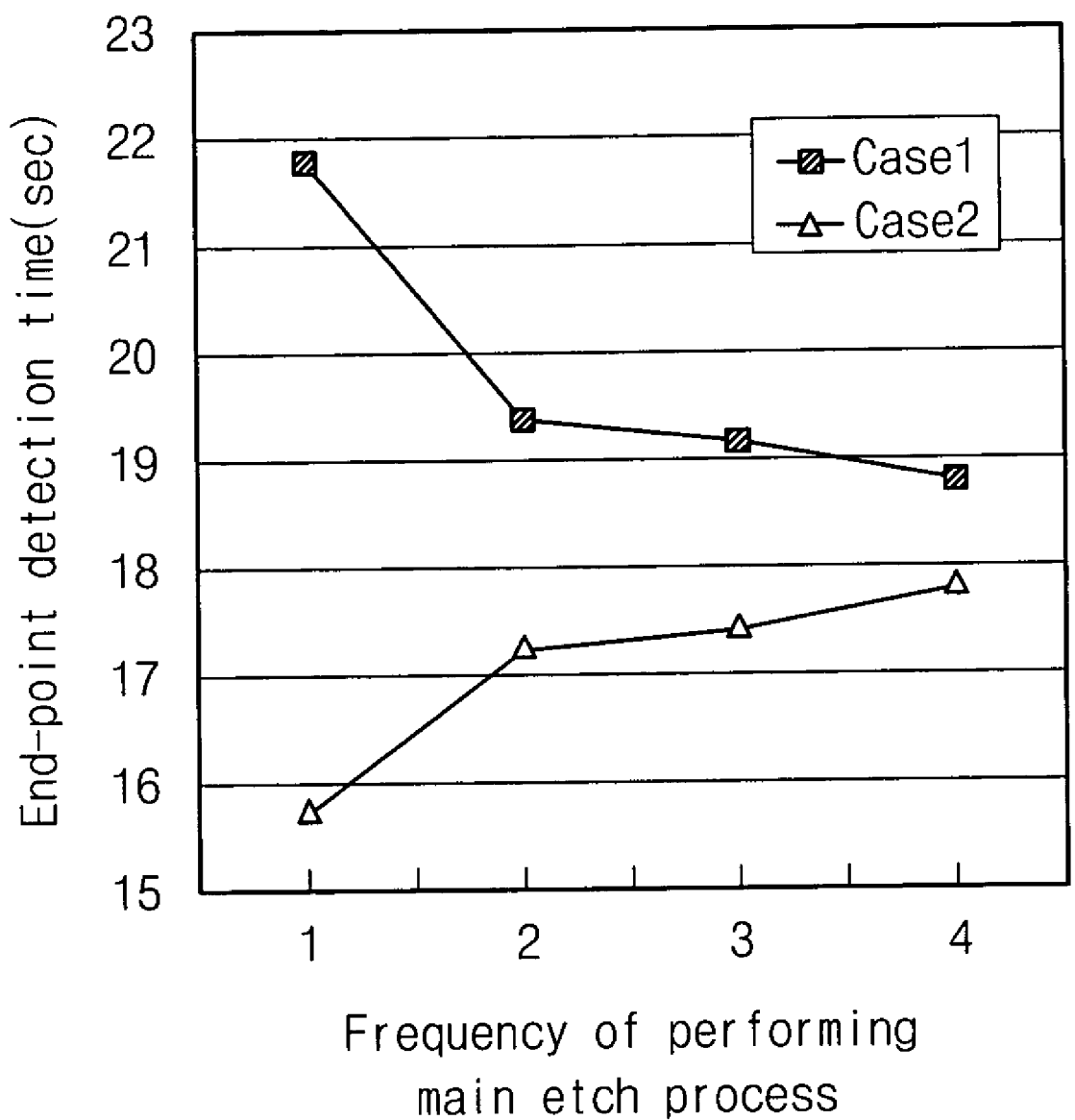
FIG. 1 is a graph showing experimental results obtained by performing a conventional dry etch process.
Figure 2:
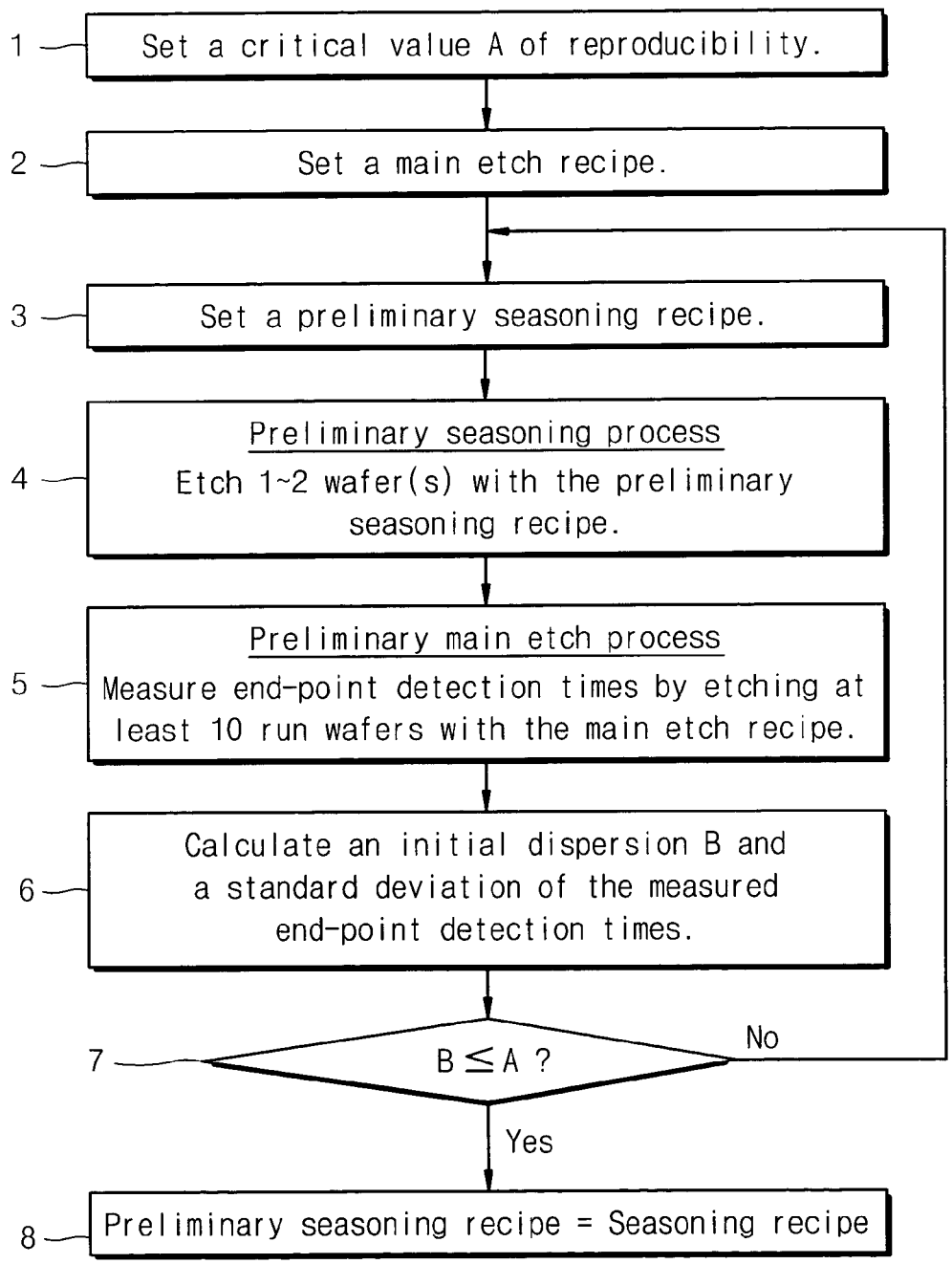
FIG. 2 is a flow chart showing a method of optimizing a seasoning recipe according to an embodiment of the present invention.

The present invention will now be described more fully with reference to the accompanying drawings, in which preferred embodiments of the invention are shown. The invention may be embodied in many different forms and nothing herein should be construed as any limitation to the scope of the invention. The embodiments described herein are provided so that this disclosure will be thorough and complete, and will fully convey the scope of the invention to those skilled in the art. FIG. 2 is a flow diagram illustrating a method for optimizing a seasoning recipe for a dry etch process according to an embodiment of the present invention. Initially, a critical value of reproducibility A is set (step 1). Preferably, the critical value of reproducibility A is proportional to a standard deviation of measured end-point detection times (as explained below), and preferably corresponds to about 1 to 6 times the standard deviation. Next, a main etch recipe is set (step 2). The main etch recipe means etch conditions such as kinds of etch gases, flow rates of etch gases, process pressure, process temperature and an etch sequence, which are used in the main etch process.

Next, a preliminary seasoning recipe is set (step 3). The preliminary seasoning recipe can be modified on the basis of the main etch recipe. A preliminary seasoning process is then performed in a dry etch chamber using the preliminary seasoning recipe to etch about 1 to 2 test wafers (step 4).

A preliminary main etch process is then performed to etch run wafers in the dry etch chamber using the main etch recipe (step 5). Preferably, the preliminary main etch process is repeatedly performed for at least ten run wafers, and an end-point detection time is determined for each run wafer.

Then, an initial dispersion B and a standard deviation are determined based on the measured end-point detection times (step 6). In one embodiment, the initial dispersion B is preferably determined as an absolute value of the difference between the measured end-point detection time of the first run wafer and that of the third run wafer. Moreover, the standard deviation is preferably determined using the measured end-point detection times for the fourth through tenth run wafers. The critical value of reproducibility A is then determined based on the computed standard deviation.

The initial dispersion B is then compared to the critical value of reproducibility A (step 7). If the initial dispersion B is less than or equal to the critical value of reproducibility A (affirmative determination in step 7), the preliminary seasoning recipe (set in step 3) will be used as the seasoning recipe for the etch process (step 8). On the other hand, if the initial dispersion B is greater than the critical value of reproducibility A (negative determination in step 7), then the process flow returns to step 3 to reset/modify the preliminary seasoning recipe. The process (steps 4–7) is repeated using the new preliminary seasoning recipe. The process (step 3–7) will be repeated until the initial dispersion B is determined to be less than or equal to the critical value of reproducibility A.

Figure 3:
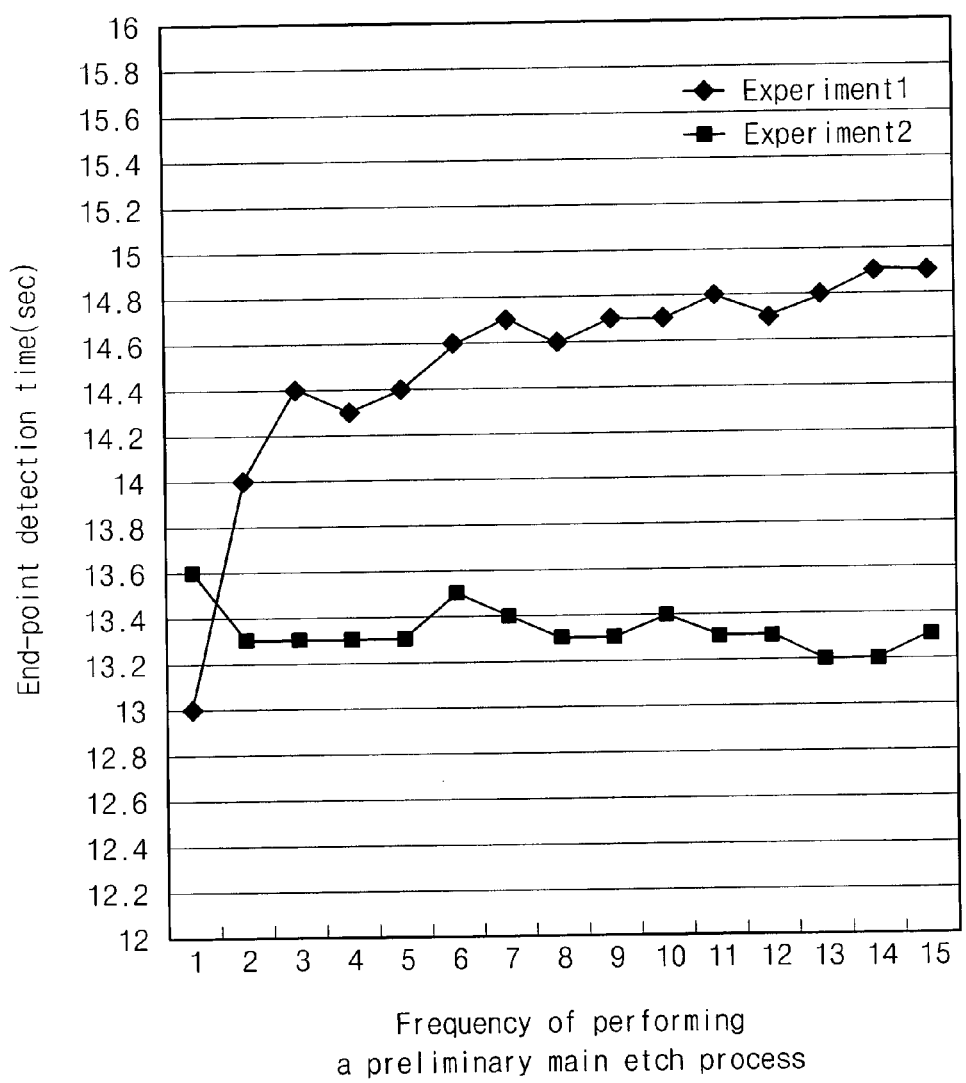
FIG. 3 is a graph showing experimental results obtained using a dry etch method with an optimal seasoning recipe, according to an embodiment of the present invention.

A method of obtaining a seasoning recipe in a dry etch process for forming a gate electrode according to an exemplary embodiment of the invention will now be explained with reference to the flow diagram of FIG. 2. Experimental results obtained based on such exemplary embodiment are shown in FIG. 3.

In this exemplary embodiment, a critical value of reproducibility A is selected to be four times (4×) the standard deviation (step 1). Next, a main etch recipe is preferably set (step 2) as follows. A pad oxide layer, a polysilicon layer, and a tungsten silicide layer are sequentially stacked on a run wafer, and a hard mask pattern is formed on the tungsten silicide layer on the run wafer. The run wafer is then loaded into a dry etch chamber. In the dry etch chamber, the tungsten silicide layer is etched using the hard mask pattern by supplying $Cl_2$ at about 100 sccm and $SF_6$ at about 5 sccm at about 3 mTorr and at about 50° C. After etching the tungsten silicide layer, the $Cl_2$ and $SF_6$ gases are exhausted. Preferably, completion of the etch process of the tungsten silicide is determined by using an optical emission spectroscopy (OES). The polysilicon layer is then etched by supplying HBr at about 60 sccm and $O_2$ at about 3 sccm at about 20 mTorr and at about 50° C. in the dry etch chamber for a predetermined amount of time. After the predetermined amount of time, the HBr and $O_2$ gases are exhausted, and the run wafer is unloaded. The main etch process can be repeatedly performed with respect to one lot of like run wafers.

In this exemplary embodiment, a preliminary seasoning recipe is initially selected (step 3) to be identical to the main etch recipe. A test wafer is loaded in the dry etch chamber and the test wafer is etched using the preliminary seasoning recipe (step 4). The test wafer comprises a polysilicon layer is stacked on a semiconductor substrate. After finishing the preliminary seasoning process, the test wafer is unloaded.

A run wafer is then loaded into the dry etch chamber to perform a preliminary main etch process (as described above). The run wafer is identical to the wafer that is to be treated in the actual main etch process, and includes a polysilicon layer and a tungsten silicide which are sequentially stacked. The polysilicon layer is etched for a predetermined amount of time. The preliminary main etch process is performed repeatedly with respect to 15 run wafers, and end-point detection times were measured.

FIG. 3 illustrate measured end-point detection times for Experiments 1 and 2 that were obtained by simulating the above exemplary process. For Experiment 1, an initial dispersion and a standard deviation were determined (step 6) using the end-point detection time data of experiment 1 in FIG. 3. Based on such data, the initial dispersion B (the absolute value of difference between the first datum and the third datum) was determined to be 1.4. Moreover, the standard deviation (using the fourth through fifteenth data) was determined to be 0.182. By multiplying the calculated standard deviation by 4, the critical value of reproducibility A was about 0.726. In this instance, since the initial dispersion B (1.4) is greater than the critical value of reproducibility A (0.726), a new preliminary seasoning recipe is set (return to step 3).

Continuing with the exemplary embodiment, the seasoning recipe is modified by setting the flow rate of oxygen to be twice that of the seasoning recipe for Experiment 1. In other words, the new (reset) preliminary seasoning recipe is the same as the original preliminary seasoning recipe, except that the flow rate of oxygen is 6 sccm instead of 3 sccm.

The preliminary seasoning process (step 4) is repeated in the same dry etch chamber using the reset preliminary seasoning recipe. The preliminary main etch process (step 5) is repeatedly performed for about 15 similar run wafers using the main etch recipe, and the end-point detection times are determined for the run wafers, which are shown in FIG. 3 for Experiment 2.

Using the data of Experiment 2, the initial dispersion B and a standard deviation were determined to be about 0.3 and about 0.083, respectively. The critical value of reproducibility was determined to be about 0.334, which is 4× the standard deviation, 0.083. With Experiment 2, the initial dispersion (0.3) is less than the critical value of reproducibility A (0.334). Since the initial dispersion is in a tolerance limit (step 7), the preliminary seasoning recipe of the Experiment 2 can be used as the actual seasoning recipe (step 8).

Thus, according to the present invention, a seasoning recipe is optimized to embody a reproducible dry etch process.

It is to be understood that the present invention may be implemented using any suitable automated etching system (as is known in the art), which operates under the control of a computer-based system comprising various forms of hardware, software, firmware, special purpose processors, or any combination thereof. The method steps described herein (FIG. 2) may be implemented in software as an application comprising program instructions that are tangibly embodied on one or more program storage devices (e.g., hard disk, magnetic floppy disk, RAM, CD ROM, ROM and Flash memory), wherein such instructions are executable by any device or machine comprising suitable architecture to perform the method steps.

While the present invention has been particularly shown and described with reference to preferred embodiments thereof, it will be understood by those of ordinary skill in the art that various changes in form and detail may be made therein without departing from the spirit and scope of the present invention as defined by the following claims.

What is claimed is:

1. A method of optimizing a seasoning recipe for an etching process, comprising the steps of:
   (a) selecting a critical value of reproducibility;
   (b) selecting a main etch recipe;
   (c) selecting a preliminary seasoning recipe;
   (d) etching a test wafer using the preliminary seasoning recipe in a dry etch chamber;
   (e) performing a main etch process for a plurality of run wafers in the dry etch chamber using the main etch recipe, and determining an end-point detection time of each run wafer;
   (f) determining an initial dispersion and a standard deviation using the determined end-point detection times;
   (g) comparing the initial dispersion to the critical value of reproducibility; and
   (h) selecting the preliminary seasoning recipe as a seasoning recipe for the etch process, if the initial dispersion is less than or equal to the critical value of reproducibility.

2. The method of claim 1, further comprising the step of changing the preliminary seasoning recipe and repeating steps (c)–(h), if the initial dispersion is greater than the critical value of reproducibility.

3. The method of claim 1, wherein the critical value of reproducibility is proportional to the standard deviation.

4. The method of claim 1, wherein the critical value of reproducibility is about 1 to 6 time(s) the standard deviation.

5. The method of claim 1, wherein the initial dispersion is determined as an absolute value of the difference between the end-point detection time of a first run wafer and the end-point detection time of a third run wafer.

6. The method of claim 5, wherein the standard deviation is determined using the end-point detection times of a fourth run wafer through at least a tenth run wafer.

7. The method of claim 1, wherein the test wafer comprises an oxide layer or a polysilicon layer formed on a substrate.

8. The method of claim 1, wherein the run wafer comprises a polysilicon layer and a tungsten silicide layer which are sequentially stacked on a substrate.

9. The method of claim 8, wherein the end-point detection time is determined when the tungsten silicide layer is substantially or completely etched.

10. The method of claim 1, wherein the main etch recipe and the preliminary seasoning recipe use the same etch gas.

11. The method of claim 10, wherein the same etch gas comprises a mixture of HBr and $O_2$.

12. The method of claim 11, wherein flow rates of the HBr and $O_2$ are changed in step (c) when selecting a preliminary seasoning recipe.

13. A method for optimizing a seasoning recipe for a dry etch process, comprising the steps of:
   (a) selecting a preliminary seasoning recipe;
   (b) etching one or more test wafers using the preliminary seasoning recipe in a dry etch chamber and then performing a preliminary main etch process for a plurality of run wafers in the dry etch chamber using a main etch recipe to determine an end-point detection time of each run wafer;
   (c) processing the end-point detection times of the run wafers to determine one or more optimization parameters; and
   (d) evaluating the optimization parameters to determine whether to (i) use the preliminary seasoning recipe as a seasoning recipe for the dry etch process or to (ii) modify the preliminary seasoning recipe and repeat steps (b)–(d) using the modified seasoning recipe,
   wherein the optimization parameters comprise an initial dispersion parameter that is determined as an absolute value of the difference between the end-point detection time of a first run wafer and the end-point detection time of a subsequent run wafer,
   wherein the optimization parameters comprise a standard deviation that is determined using end-point detection times of a plurality of the run wafers,
   wherein the optimization parameters comprise a critical value of reproducibility that is determined based on the standard deviation, wherein the step of evaluating the optimization parameters comprises:

comparing the initial dispersion to the critical value of reproducibility; and selecting the preliminary seasoning recipe as a seasoning recipe for the dry etch process, if the initial dispersion is less than or equal to the critical value of reproducibility.

14. The method of claim 13, wherein the preliminary seasoning recipe is modified if the initial dispersion is greater than the critical value of reproducibility.

* * * * *